United States Patent [19]
Selbrede

[11] Patent Number: 5,383,971
[45] Date of Patent: * Jan. 24, 1995

[54] DIFFERENTIAL PRESSURE CVD CHUCK

[75] Inventor: Steven C. Selbrede, San Jose, Calif.

[73] Assignee: Genus, Inc., Mountain View, Calif.

[*] Notice: The portion of the term of this patent subsequent to Mar. 10, 2009 has been disclaimed.

[21] Appl. No.: 849,488

[22] Filed: Mar. 11, 1992

Related U.S. Application Data

[63] Continuation of Ser. No. 596,512, Oct. 12, 1990, Pat. No. 5,094,885.

[51] Int. Cl.$^6$ ............... C23C 16/00; C23C 16/46
[52] U.S. Cl. ................. 118/728; 118/719; 118/724
[58] Field of Search ........... 118/725, 728, 715, 724; 156/345; 204/298.15

[56] References Cited

U.S. PATENT DOCUMENTS

| | | | |
|---|---|---|---|
| 4,512,391 | 4/1985 | Harra | 118/725 X |
| 4,857,142 | 8/1989 | Syverson | 156/345 X |
| 4,990,374 | 2/1991 | Keeley et al. | 118/725 X |
| 5,000,113 | 3/1991 | Wang et al. | 118/725 X |
| 5,033,407 | 7/1991 | Mizuno et al. | 118/725 |
| 5,090,900 | 2/1992 | Rudolf et al. | 118/728 X |
| 5,094,885 | 3/1992 | Selbrede | 118/728 X |
| 5,230,741 | 7/1993 | Van de Ven et al. | 118/728 |

FOREIGN PATENT DOCUMENTS

| | | |
|---|---|---|
| 3633386-A | 4/1988 | Germany . |
| 60-136314 | 7/1985 | Japan ............ 118/728 |

OTHER PUBLICATIONS

Solid State Technology, "Tungsten exclusion ring controls deposition area", p. 26, Aug. 1991.

Primary Examiner—R. Bruce Breneman
Assistant Examiner—Jonathan D. Baskin
Attorney, Agent, or Firm—Donald R. Boys

[57] ABSTRACT

An apparatus for preventing edge and backside coating during CVD processing supports a wafer on flexible supports within a purge cavity in a pedestal such that a movable clamp ring deforms the supports, forms a slot with the frontside of the wafer around the periphery of the wafer and by contacting the pedestal isolates the purge cavity from the coating chamber except for the slot. The wafer is heated by a pyrolytic carbon heater in the cavity and purge gas is fed to the purge cavity to flow through the slot and purge coating gas from diffusing into the purge cavity to coat the heater or the edge or backside of the wafer. In an alternative embodiment plural pedestals allow processing of plural wafers in a single cycle, and a vacuum lock and automatic handling devices are provided.

12 Claims, 5 Drawing Sheets

DIFFERENTIAL PRESSURE CVD CHUCK

This is a continuation of application Ser. No. 07/596,512 filed on Oct. 12, 1990, now U.S. Pat. No. 5,094,885.

FIELD OF THE INVENTION

This invention is in the field of apparatus for performing chemical vapor deposition processes, primarily on wafers used in the manufacture of integrated circuits.

BACKGROUND OF THE INVENTION

In the manufacture of integrated circuits, thin films of various materials are formed on wafers of semiconducting material, such as doped silicon. Specific selected areas of deposited films are removed to form structures and circuitry. CVD is a well known process for depositing such thin films. For example, polysilicon is deposited from silane gas, $SiH_4$. Similarly, tungsten silicide is deposited from a mixture of gases including silane and a tungsten-bearing gas such as tungsten hexafluoride. Pure tungsten is also deposited on silicon wafers in the manufacture of integrated circuits, sometimes selectively and sometimes across the entire surface in a process known as "blanket" tungsten.

In a typical CVD process wafers are placed on supports in a chamber, the chamber is sealed and evacuated, the wafers are heated, typically by heating the wafer support, and a gas mixture is conducted into the chamber. For example, in the blanket tungsten process, tungsten hexafluoride and hydrogen are fed as reactive gases and argon may be included as a carrier gas. The tungsten hexafluoride is the source of deposited tungsten. Typically the gases are flowed continuously during processing. The temperature of a wafer to be coated is one of the variables that drives the chemical reaction to cause tungsten to be deposited. It is important to control the temperature, the relative concentration of various gases in the mixture, and such characteristics as the uniformity of flow of gas over the surface being coated, among other variables. An even thickness of a deposited layer is an important characteristic.

One of the important variables in providing a coating of uniform thickness with a CVD process is the uniformity of temperature over the surface of the wafer to be coated. The rate of deposition in a CVD process depends, among other variables, on the temperature of the wafer, so a non-uniform temperature will result in a CVD coating of non-uniform thickness.

A common arrangement in a CVD apparatus is to support a wafer against a flat surface, such as a surface on a central turret in a chamber that can be evacuated and into which CVD gases may be introduced. The turret is heated to heat the wafer. It is also known to support a wafer on a CVD chuck separate from but attached to a central turret, and to heat the chuck to heat the wafer. This arrangement allows for a lower thermal mass for the chuck and consequently a quicker response time when it is necessary to change the temperature. It is also known to mechanically press a wafer against a chuck surface at several points around the perimeter of a wafer or with a continuous ring.

In all of the cases in which a wafer is supported on a flat surface and the surface is heated to heat the wafer, even where a wafer is mechanically pressed against the surface, the wafer is not everywhere in intimate contact with the heating surface. Truly intimate contact is not within the capability of machining tolerances. The contact is at a number of points or small areas, and the rest of the wafer surface adjacent the chuck surface is close but not touching. Heat transfer from a chuck to a wafer is consequently less efficient than would be the case with intimate surface contact.

Because of the difficulty of establishing intimate contact between a wafer and a chuck surface there is usually a considerable difference between the temperature of a chuck and a wafer on the chuck. It is not unusual for the temperature difference to be more than 100 degrees Centigrade. Moreover, heat transfer at the points where the wafer actually touches the chuck is much more efficient than where it doesn't touch, so there are typically small areas on the wafer at the contact points that are hotter than the areas away from the contact points. These small areas are called "hot spots".

It is known to the inventor to machine a uniform cavity of shallow depth, such as 0.25 mm, on the surface of the CVD chuck in the area where a wafer is supported so the wafer touches only around the perimeter. This arrangement avoids hot spots except at the contact region around the periphery. It is also known to the inventor to conduct a gas such as argon into the space behind the wafer to improve the heat transfer from the chuck to the wafer across the shallow cavity. Non-uniform gas flow, however, still introduces non-uniformity in heating the wafer. The gas, for example, must spread radially and therefore pass through a larger and larger cross-sectional area, which introduces non-uniformity in pressure and density. It is also known to conduct an inert gas to the backside of a wafer without a shallow cavity behind the wafer. This method has been largely unsuccessful as well, for many of the same reasons as gas flow with a cavity behind the wafer.

In most cases, circuitry is formed on only one side of a wafer. The side not used for circuitry is called the backside of the wafer. In lithography procedures for defining patterns on deposited layers, the backside of a wafer is often used as a registering surface. For this and other reasons it is important that the backside of a wafer be kept smooth and clean, and that, in general, little or no material be deposited on the backside.

Another important characteristic in layering is that the deposited layers adhere well to the base wafer material or to the next underlying layer, so layered material doesn't flake or peel. The dimensions of structures and circuitry in integrated circuit technology are very small, so any unwanted flaking or peeling may easily spoil structures or circuitry. Also, flakes from a non-adherent layer may damage sensitive equipment and require cleaning of coating apparatus more often than would otherwise be necessary. The extra cleaning lowers production time.

Several techniques are used to enhance adhesion of layers deposited by CVD. One is to deposit a thin layer of a material known as an adhesion layer or a glue layer. The adhesion layer in some cases is an entirely different material known to adhere well to both the base material and to the new layer to be applied. For example, titanium is in some cases deposited by sputtering as an adhesion layer before depositing tungsten or a tungsten rich material, such as tungsten silicide, by CVD. Cleaning procedures, such as ion bombardment, are also used to prepare wafer surfaces to receive layers deposited by chemical vapor deposition.

It is usually desireable to do pretreatment steps and to deposit adhesion layers (if used) while a wafer is mounted in the same chamber and on the same apparatus that will be used to do the CVD. Otherwise the wafers to be coated have to be handled more often and mounted to and dismounted from different processing apparatus, which is time consuming and increases the chances of damage, error, and contamination. Since the wafers are typically mounted in the CVD chamber with the backside against a support, only the frontside is presented to process steps designed to enhance adhesion. If only the frontside is cleaned or otherwise treated, coating on the backside makes the possibility of edge peeling or flaking greater.

The fact of non-intimate contact between a wafer and the chuck, and the difficulty of making a seal that is impervious to gas between a wafer and a chuck leads to edge and backside coating problems. Also, because cleaning and other pre-treatment is usually effective only on the front surface, deposition on the edge and backside of a wafer is more likely to flake and peel.

Intrusion of deposition gases to the edge and the backside of a wafer presents another difficulty as well. This intrusion causes deposition on the chuck surface. This deposition, while it might represent a very small amount on the edge or backside of a wafer, is accumulative on the chuck surface. A new wafer is placed on the chuck for each deposition cycle, but the same chuck surface is coated time after time.

In the cases where a wafer rests directly on the chuck, even at the perimeter of the wafer only, an accumulation of deposited material over time can cause physical problems, such as flaking and improper seating of the wafer on the chuck. Another serious problem is that a coating deposited on the chuck will usually be a different material than the chuck, and will have a different emissivity than the chuck material. This can cause non-uniform radiant heating from the chuck to the wafer and result in non-uniform wafer temperature and subsequent non-uniform deposition thickness.

It is known to the inventor to limit backside and edge deposition by a perimeter wafer seal, including a proximity seal, during CVD processing. It is also known to combine the perimeter wafer seal and proximity seal with a flow of a non-reactive gas, such as nitrogen or argon, to the backside of the wafer, with or without a cavity behind the wafer on the chuck surface. All of the apparatus and methods known to the inventor prior to the present invention still have limitations in temperature uniformity and in limiting edge and backside deposition.

Another problem with CVD apparatus in general is efficient use of coating material. For example, in a CVD system with a heated central turret there is considerable exposure of heated turret area other than the area occupied by wafers to be coated. The result is use of coating gases to coat the turret, resulting in higher than necessary usage of coating gas material. For example, where tungsten hexafluoride is used, the gas is very highly purified and therefore expensive. Moreover, the excess coating causes particulate and cleaning problems. Even in systems with individual chucks it is difficult to heat only the surface occupied by a wafer, so there is still deposition on the chuck, wasting expensive gas and causing a particulate and cleaning problem.

In CVD processes it has quite recently become feasible to operate at much higher pressures than has been usual in the past. Higher total pressure for process gases can result in better hole filling efficiency and better step coverage than is possible at lower pressure. Hole filling efficiency refers to the relative ability to completely fill holes on a wafer surface without having a void. Step coverage refers to the relative ability to coat evenly on the walls of holes or other depressions on a wafer surface.

Higher coating pressure also promotes higher deposition rate, hence higher throughput of wafers for a CVD system. In processes where the typical total pressure has been in the past less than 1 Torr, processes are becoming feasible at 200 Torr and even higher pressures. At the higher pressures being used and contemplated, it is much more difficult to prevent edge and backside coating than is true at much lower total process pressure.

It is also true that efforts to prevent edge and backside coating by flowing non-reactive gas, such as argon, behind a wafer at the higher coating pressures being contemplated, such as 200 Torr and higher, may result in pressure differential across a wafer great enough to deform the wafer and cause even greater temperature non-uniformity and resulting thickness non-uniformity.

What is clearly needed is apparatus and methods for CVD processing to enhance temperature uniformity while reducing edge and backside coating still further over known apparatus and methods. Ideally such an apparatus and method will have low thermal mass, providing for quick reaction to change temperature. Also, the apparatus needs to be able to selectively heat a mounted wafer without heating other surfaces exposed to coating gas, so a minimum amount of excess coating will result. The apparatus needed also must be able to accomplish these advantages at total coating pressures very much higher than presently used for CVD processes.

SUMMARY OF THE INVENTION

In a preferred embodiment an apparatus is provided for preventing edge and backside coating on a wafer with a chamber for performing CVD processing, a pedestal with a purge cavity, and flexible wafer supports supported by the pedestal. A movable clamp ring having contact pads contacts a wafer on the flexible wafer supports forming a slot with the frontside of the wafer around the periphery of the wafer. The clamp ring urges the wafer against the flexible wafer supports, deforming the supports, contacts the pedestal, and with the purge cavity and the wafer, forms an enclosure separate from the coating chamber.

A heater within the purge cavity heats the wafer, coating gas is conducted to the processing chamber, and purge gas is conducted to the purge cavity to flow out through the slot excluding coating gas from migrating to the edge or backside of the wafer during processing.

In a preferred embodiment the wafer supports are leaf springs, and in an alternative embodiment ceramic buttons attached to the springs actually contact the wafer.

The heater in the preferred embodiment is a pyrolytic carbon heater and is trimmed by machining to heat the wafer evenly. Temperature uniformity is enhanced by spacing the heater from the wafer by a distance at least ten times the length of the mean free path for purge gas at the pressure and temperature of the purge gas during processing. Further, the minimal contact of the clamp ring with the wafer and supporting the wafer on flexible supports provides for the wafer frontside being the only surface exposed to coating gas at coating temperature.

By having a heater of relatively small mass within the purge cavity, and heating primarily the wafer with small mass, heating can be done quickly and cooling equally rapidly.

The invention allows slot height and gas flow to be optimized for different processes at different coating pressures. A further advantage is that the heater is enclosed in the separate enclosure so the heater is not coated and emissivity of the heater is not variable as a result. By having the wafer as the only hot surface exposed to coating gas, the use of expensive coating gas is minimized as well, and expensive cleaning procedures and downtime for service are minimized; production time is maximized.

Embodiments are provided having plural supports and plural clamp rings within a single chamber so plural wafers can be coated in a single processing cycle, and with a vacuum lock and automatic equipment to automate handling wafers through the system.

DESCRIPTION OF THE PREFERRED EMBODIMENTS

Figure 1:
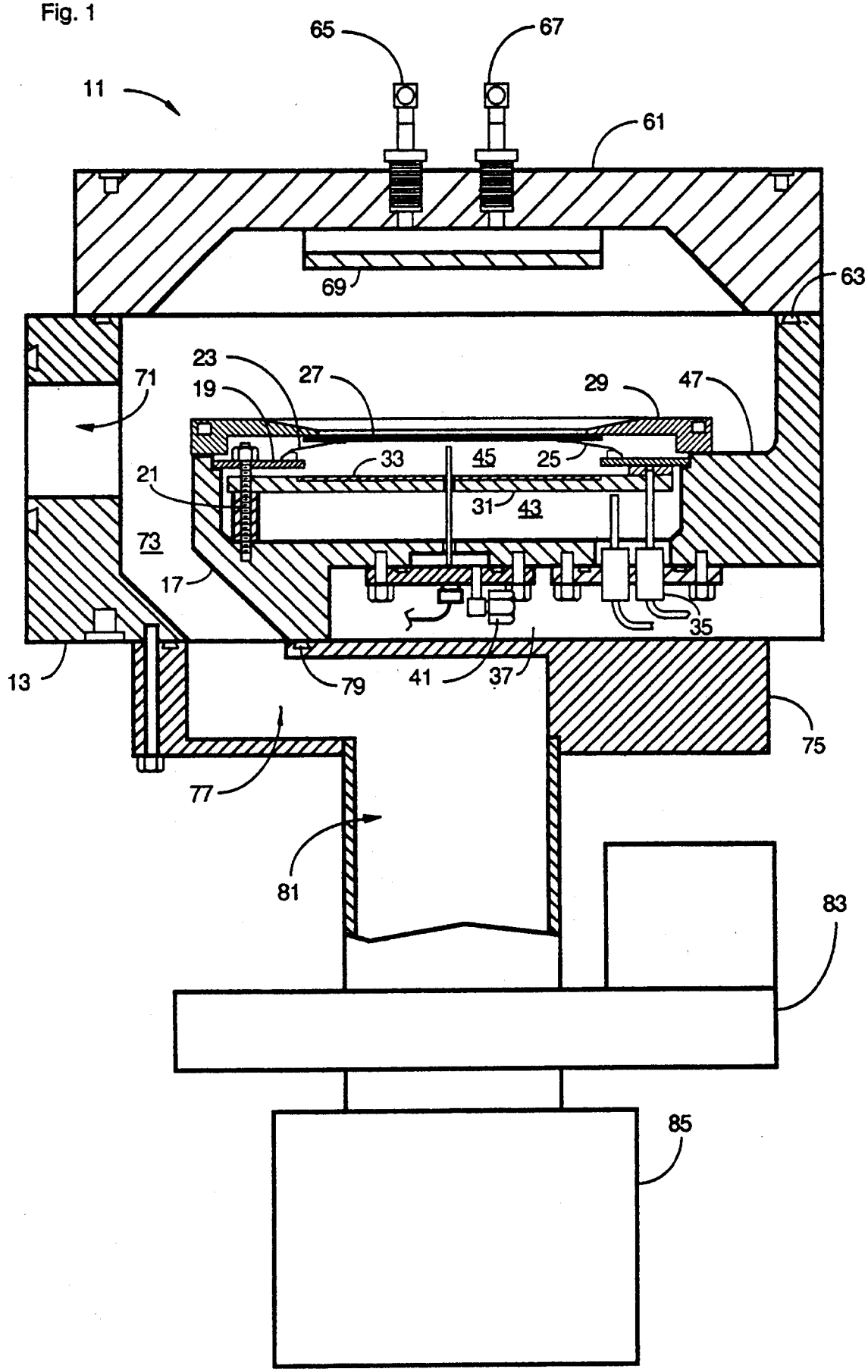
FIG. 1 is a cutaway of a single-station apparatus according to a preferred embodiment of the invention.

FIG. 1 is a cut-away elevation view of a single-station CVD coating apparatus 11 according to a preferred embodiment of the invention. The main body of the CVD chamber is a specially machined block of aluminum 13 with an entrance opening for loading wafers, multiple ports for analytical gauges, and passages for vacuum pumping of the process gases.

Machining of body 13 provides a central pedestal 17 with a mounting shoulder and register for a support ring 19 held in position by threaded studs 21 in a circular pattern. Support ring 19 carries flexible wafer supports such as 23 and 25 arranged in a circular pattern to support a wafer 27 during processing. In the preferred embodiment the wafer supports are leaf spring elements with a small contact area to touch the wafer.

A movable clamp ring 29 may be raised to allow a wafer to be placed on the supports. The clamp ring is then moved toward a loaded wafer, contacting the wafer with contact pads and providing a controlled width slot everywhere else around the periphery of the wafer. Three points of contact by three pads is ideal since three points define a plane and a minimum number of contact points is preferred, but more than three points could also be used. The support ring can be cooled in use by a coolant at a suitable temperature conducted in a channel in the ring.

A heater plate 31, supported substantially concentric with support ring 19 and wafer 27 incorporates a pyrolytic graphite heater 33 that is powered through a sealed electrical feedthrough 35. Clearance for mounting feedthroughs and connections is provided by a cavity 37 in casting 13. Cavity 37 is open at radial passage for connections to exit.

An inert gas, argon in the preferred embodiment, is delivered through an inlet fitting 41 into a cavity 43 behind heater plate 31, where it flows around the heater plate to cavity 45 behind the wafer. The purpose of this gas flow is to prevent coating gases from diffusing behind the wafer, where they could cause coating of material on the backside and edge of the wafer. The gas is called purge gas because it purges the coating gases from the backside of the wafer.

With clamp ring 29 against wafer 27, depressing the flexible wafer supports the clamp ring contacts body 13 in a complete circle on surface 47. There is then no path for purge gas to escape from behind the wafer into the process chamber except through the narrow passage between the clamp ring and the wafer around the wafer periphery.

In the preferred embodiment several kinds of instruments are mounted within cavity 37 for taking measurements for experimentation and control.

A lid casting 61 is mounted to the open end of body 13 and sealed in the preferred embodiment by an o-ring seal 63. The mounting fasteners are conventional fasteners and are not shown. Gas feedthroughs 65 and 67 are for conducting coating gases into the process chamber volume during process and a baffle 69 helps to distribute the coating gases evenly as they flow into the coating chamber volume.

Opening 71 into the coating chamber is for entrance of a robotic transfer, not shown, that carries a wafer to be coated from outside the coating chamber into the chamber and places the wafer on the flexible wafer supports while the clamp ring is retracted. The same robotic device retrieves a coated wafer from the supports and carries it through the opening out of the coating chamber when processing is complete. In an alternative preferred embodiment a separate vacuum lock chamber is attached to the coating chamber at opening 71 with a valve to close the opening during process and separate valving and pumping apparatus not shown so the lock chamber can be cycled to vacuum and atmospheric pressure separately from the coating chamber. This allows wafers to be loaded and unloaded in the vacuum lock and the vacuum lock to be cycled to vacuum pressure while a wafer is being processed in the coating chamber. Such load/unload lock chambers are known in the art.

Passage 73 is a pumping passage in the preferred embodiment. Manifold weldment 75 has a matching passage 77, and o-ring 79 forms a seal where the passages join. Typically, more than one pumping passage is used. The pumping passages lead to a central passage 81 in the manifold. Vacuum valve 83 leads to a turbomolecular vacuum pump 85. There are other vacuum valves and roughing pumps, not shown, such as are typical in single-station systems in the art.

In the preferred embodiment clamp ring 29 is pivoted as a hinge near one side of the coating chamber volume, not seen in FIG. 1, and moved by means of a ferrofluidic sealed mechanical motion device. This is but one of many ways that the clamp ring may be moved, and many other ways are known in the art.

In operation, assuming no wafer in the process chamber and the process chamber under vacuum, a typical coating operation proceeds as follows: clamp ring 29 is moved away from pedestal 17 providing room for the robotic handler to place a wafer. Next, a wafer is placed on the flexible wafer supports and retracts, and the clamp ring moves until it contacts the pedestal. The contact of the clamp ring to the wafer leaves a controlled width slot on the frontside around the periphery of the wafer, as described above.

Next, purge gas is introduced into the cavity behind the wafer and escapes through the controlled height slot. The heater power is controlled during this sequence to achieve the desired wafer temperature. When the wafer temperature is correct, which varies depending on process specifications, coating gases are introduced into the chamber and material is deposited on the frontside of the wafer.

The sequence described is typical, and may vary to some degree. For example, the heater power may be changed for various reasons, or the purge gas may be on continuously during loading. There are many other changes that may be made in the order of acts to accomplish coating a wafer in the described preferred embodiment, and in other embodiments of the invention.

Figure 2:
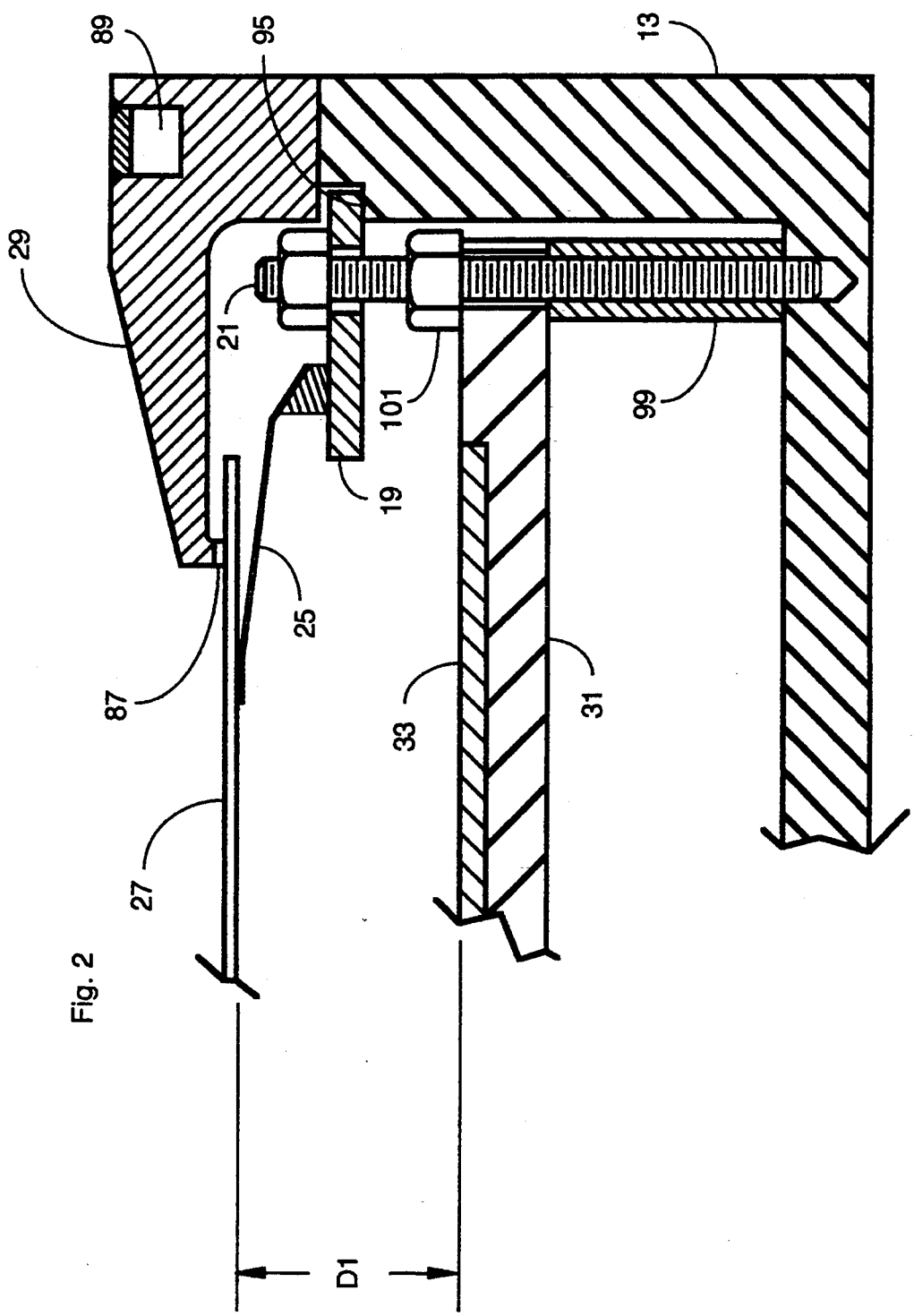
FIG. 2 is an enlarged cutaway view of elements in contact with a wafer in the preferred embodiment.

FIG. 2 is a partial section on a radial line through one side of the pedestal, heater plate, support ring and a wafer, at a larger scale than FIG. 1, to better illustrate the relationship between some of the elements. Wafer 27 is shown supported by a flexible wafer support 25. Clamp ring 29 has three contact pads for contacting wafer 27, and one pad 87 is shown. The clamp ring also has a water channel 89 for cooling the ring during processing.

Mounting ring 19 rests in a shoulder 95 machined in the body for that purpose, and is held in position by conventional fastener 21.

Heater plate 31 with pyrolytic graphite heater 33 is spaced from the lower wall of body 13 by cylindrical spacers 99 in the preferred embodiment.

When purge gas is conducted to the backside of the wafer and flows out of the controlled slot, the purge gas behind the wafer is maintained at a higher pressure than the total pressure of the coating gases. This difference in pressure is required to insure that purge gas flows out of the controlled slot into the process chamber, preventing coating gases from flowing through the slot into the cavity behind the wafer. In practice it has been found that a slot height of 0.127 mm (0.005 inches) and an argon purge gas flow of 10 sccm provides excellent protection against edge and backside deposition for silane-reduced selective tungsten deposition. Other processes, such as hydrogen reduced blanket tungsten deposition, may require a smaller slot height or a lesser purge gas flow in order to protect against diffusion of coating gases behind the wafer. This depends on process chemistry, process pressure, and other characteristics.

Distance D1 in the preferred embodiment is about 12.7 mm (0.5 inch) and provides clearance for mounting the wafer supports. It has been found that any distance equal to or greater than ten times the mean free path of the purge gas at the operating pressure of the purge gas is adequate for the purpose of heat transfer.

Figure 3:
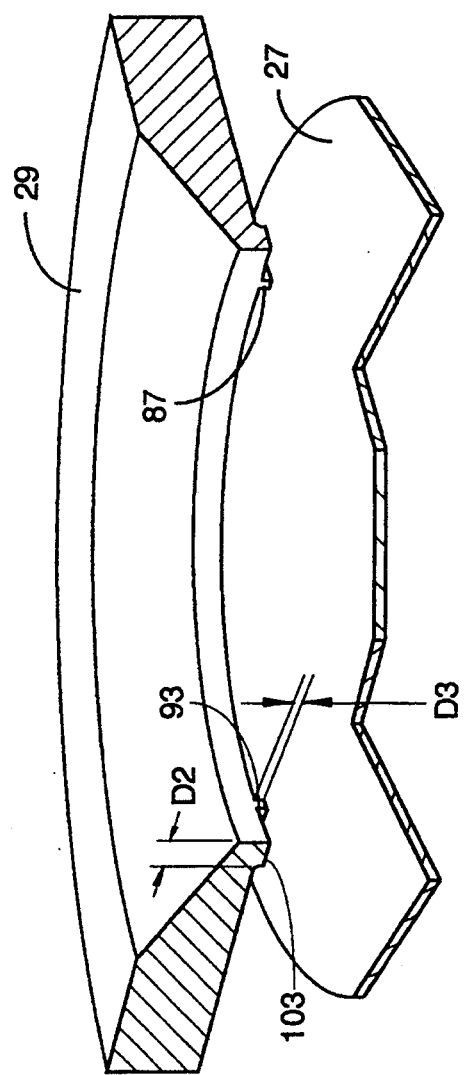
FIG. 3 is a sectioned view of a clamp ring in contact with a wafer to illustrate how a slot is formed.

FIG. 3 is a perspective view of clamp ring 29 to better illustrate the geometry that forms a controlled slot between the clamp ring and the wafer. A portion of clamp ring 29 is shown in contact with wafer 27 by two of the contact pads (87 and 93 are shown). The clamp ring has a lip portion 103 of width D2 that forms a surface parallel to the wafer everywhere except at the contact pads. The width D2 of the lip portion is about 1 mm, and the height D3 of each of the contact pads is about 0.127 mm (0.005 inch). The height of the contact pads may be controlled by changing the clamp ring, so different heights may be used for different processes. When the clamp ring is in contact with the wafer there is a controlled slot of 0.127 mm height nearly all the way around the wafer periphery. Purge gas delivered to the backside of the wafer passes through this slot.

The present invention is useful for known CVD processes such as blanket tungsten, selective tungsten, and others, and the purge gas flow may be adjusted to accommodate processes of any pressure from below 1 mTorr to atmospheric pressure. To exclude coating gases from diffusing through the slot to the edge and backside of a wafer in process, it is important that the slot height (D3 in FIG. 3) in combination with the purge gas flow provides an impulse (mass times velocity) for the purge gas in the slot greater than the impulse of the coating gas diffusing in the opposite direction. The larger the differential pressure the more effectively the coating gas is excluded from the wafer backside. However, if the pressure difference is too large, the purge gas can jet into the coating gases and upset the gas flow dynamics for the deposition, which can result in uneven coating, particularly around the edges of the wafer near the slot. For different processes at different pressures, a proper flow and pressure differential is found experimentally, by increasing the purge gas flow in steps while keeping the slot height the same, until edge and backside coating is suppressed but coating dynamics are not upset. If the coating dynamics are upset before edge and backside coating is suppressed, the slot height can be changed and experiments repeated. In this way an optimum slot height and purge gas flow can be established for any process condition. For selective tungsten deposition in the single-station coating apparatus of the preferred embodiment, a slot height of about 0.127 and a purge gas flow of about 10 sccm was found to be satisfactory.

Figure 4:
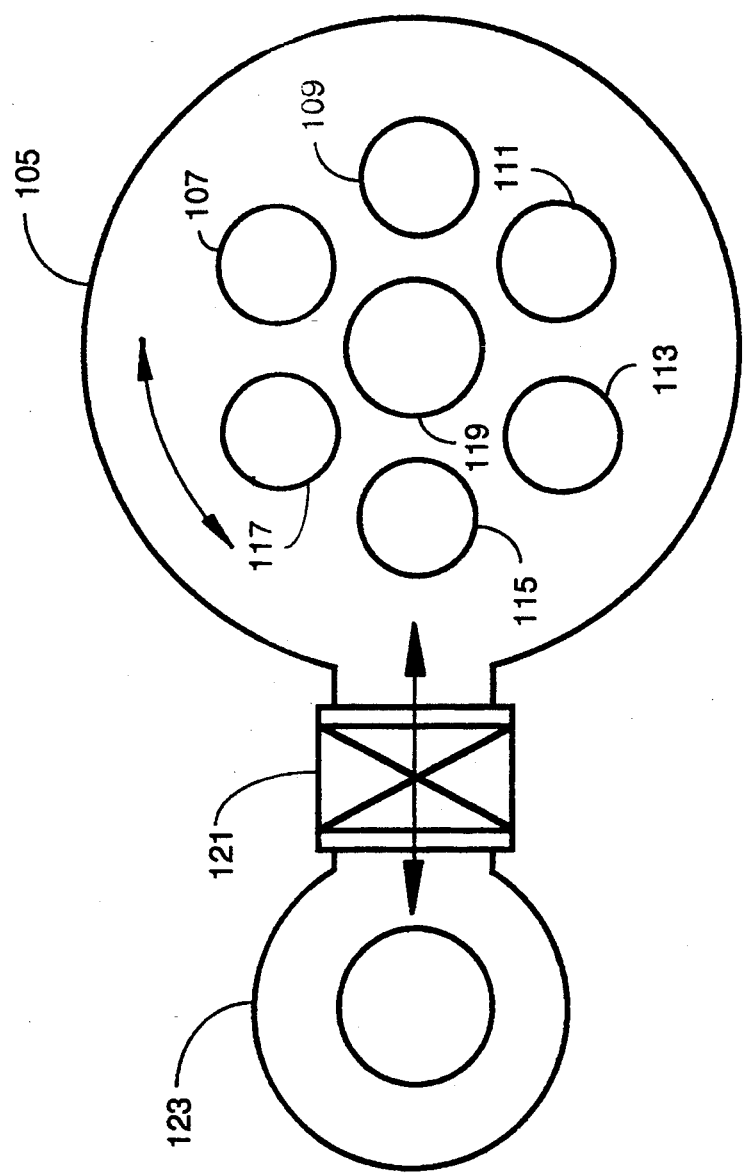
FIG. 4 is a schematic of an alternative preferred embodiment with a rotating turret and a vacuum lock.

In the preferred embodiment, as described above, the coating apparatus of the invention is a single-station apparatus coating one wafer per processing cycle. It is not required that the apparatus be a single-station apparatus, however. The arrangement of the invention may also be applied to systems with more than one station so that more than one wafer may be coated per processing cycle. FIG. 4 is a schematic plan view of a coating system with 6 stations each similar to the single station apparatus described in the preferred embodiment.

In FIG. 4 a chamber 105 has a rotating turret with 6 single-station coating positions 107, 109, 111, 113, 15, and 117. Each has a heater, support pedestals, a movable clamp ring, and so forth, similar to the single station apparatus described above. Utility connections are to a central turret 119 with appropriate rotating feedthroughs known in the art for transferring necessary motion and power across the chamber enclosure.

Chamber 105 is connected by a vacuum valve 121 to a vacuum-lock chamber 123 so that a robotic mechanism (not shown) may transfer wafers into and out of chamber 105 when valve 121 is open. The vacuum-lock chamber has another valved opening (not shown), so that wafers may be admitted from outside the system when the vacuum-lock is vented. The vacuum-lock has mechanism allowing 6 wafers to be loaded from outside for each coating cycle.

In operation, with valve 121 open and the vacuum-lock at vacuum, a wafer is loaded to station 115, then the turret is indexed by 60 degrees to align another station with the vacuum-lock. While a station is adjacent to the vacuum-lock the clamp ring for that station is raised to admit a wafer and then lowered after the pick-and-place device retracts. The turret may rotate in either direction.

The loading process is repeated until all the six stations are loaded, then valve 121 is closed. Purge gas is admitted, process gases are admitted, heat is applied to the wafers, and so on, to accomplish CVD processing. During the processing time, wafers may be removed from the vacuum-lock and new wafers loaded, after which the vacuum-lock is pumped. When processing is done, wafers are unloaded one at a time to the vacuum-lock and new wafers loaded.

The schematic of FIG. 4 is but one of many variations that might be used to accomplish processing of more than one wafer at a time while using the apparatus of the invention.

Figure 5:
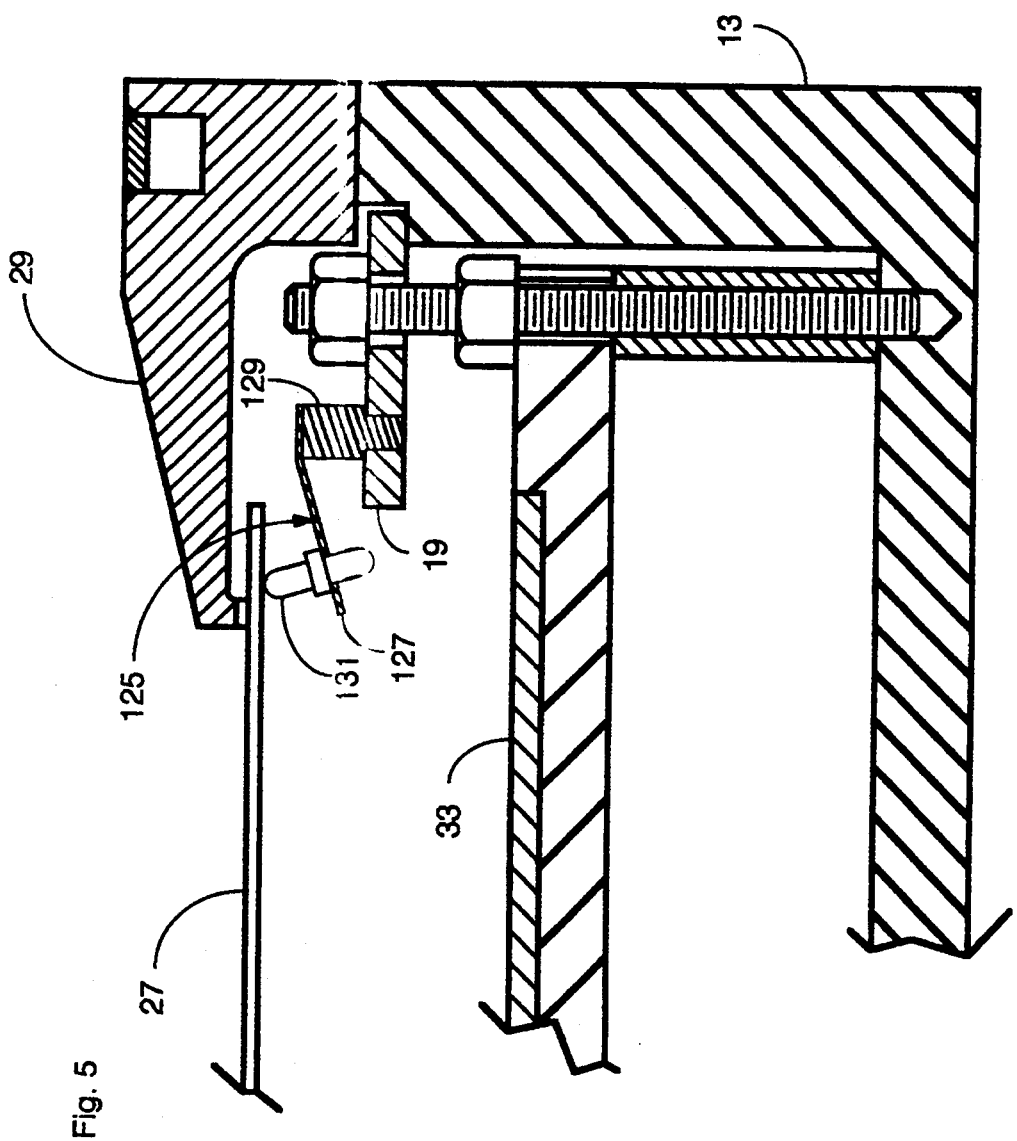
FIG. 5 is an enlarged cutaway view similar to FIG. 2, showing contact buttons attached to the flexible wafer supports.

In an alternative preferred embodiment the flexible wafer supports are not leaf springs like the springs described in the first preferred embodiment, but have an insulator button to insulate the metal spring from the wafer. FIG. 5 shows one such flexible wafer support 125 relative to a wafer 27. In this embodiment the wafer support comprises a leaf spring 127, a pin 129 and a ceramic button 131. There are other materials that may be used for the button, such as quartz.

There are many changes that may be made in the apparatus of the invention without departing from the spirit and scope of the invention. Some have already been described, such as adjustment of slot height to accommodate process conditions. A single-station apparatus has been tested for wafers of between 100 and 150 mm diameter. The apparatus is capable of accommodating wafers of 200 mm or even larger in diameter. There are a number of choices for materials for various of the elements in the preferred embodiments as well. For example, there are several materials suitable for the flexible supports with the requirement being an ability to retain spring action at the temperatures the materials experience during processing. As another example, the clamp ring can be made of quartz or alumina to provide better selective tungsten compatibility. As another example the support pieces inside the purge cavity and elsewhere in the process chamber may be made out of nickel or monel if NF3 plasmas are to be used in a process. There are clearly many other such changes that might be made within the spirit and scope of the invention.

What is claimed is:

1. An apparatus for preventing coating on the edge and backside of a substrate during processing in a processing volume comprising:
    support means for supporting the substrate during processing;
    purge cavity means for forming a slot with the front surface of the substrate around the periphery thereof, forming a purge cavity isolated from said processing volume except for said slot; and
    purge gas means for supplying purge gas to said purge cavity to flow through said slot opposing diffusion of processing gas from said processing volume to the edge and backside of said substrate.

2. An apparatus as in claim 1 wherein said substrate comprises a semiconductor wafer.

3. An apparatus as in claim 1 wherein said processing volume comprises a CVD processing chamber.

4. An apparatus as in claim 1 wherein said substrate comprises a semiconductor wafer and said processing volume comprises a CVD processing chamber.

5. An apparatus as in claim 1 wherein said purge cavity means comprises a clamp ring movable to engage said substrate on said support means forming said slot.

6. A system for performing a surface process on a substrate comprising:
    a processing volume for performing said process therein;
    processing gas delivery means for delivering processing gases to said processing volume;
    heating means for heating said substrate during said process;
    support means for supporting the substrate during processing;
    purge cavity means for forming a slot with the frontside of the substrate around the periphery thereof, forming a purge cavity isolated from said processing volume except for said slot; and
    purge gas means for supplying purge gas to said purge cavity to flow through said slot opposing diffusion of processing gas from said processing volume to the edge and backside of said substrate.

7. A system as in claims 6 comprising a plurality of said support means and purge cavity means, providing for processing of a plurality of substrates in a single processing cycle.

8. A system as in claim 7 comprising load-lock means for loading and removing substrates without venting said processing volume.

9. A system as in claim 6 wherein said substrate comprises a semiconductor wafer.

10. A system as in claim 6 wherein said processing volume comprises a CVD processing chamber.

11. A system as in claim 6 wherein said substrate comprises a semiconductor wafer and said processing volume comprises CVD process chamber.

12. A system as in claim 6 wherein said purge cavity means comprises a clamp ring movable to engage said substrate on said support means forming said slot.

* * * * *